United States Patent
Lee et al.

(10) Patent No.: US 6,869,839 B2
(45) Date of Patent: Mar. 22, 2005

(54) METHOD OF FABRICATING A SEMICONDUCTOR DEVICE HAVING AN L-SHAPED SPACER

(75) Inventors: Sang-jin Lee, Seoul (KR); Tae-soo Park, Seongnam (KR); Young-gun Ko, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/449,924

(22) Filed: May 30, 2003

(65) Prior Publication Data

US 2004/0097031 A1 May 20, 2004

(30) Foreign Application Priority Data

Nov. 14, 2002 (KR) .................. 10-2002-0070864

(51) Int. Cl.⁷ .................. H01L 21/8234; H01L 21/336
(52) U.S. Cl. ....................... 438/238; 438/305
(58) Field of Search ................. 438/200, 238, 438/275, 279, 301, 302, 303, 305, 306, 381, 382, 522, 533, 592; 257/350, 358, 359, 360, 363, 380, 516, 543, E21.2, E21.444, E29.269

(56) References Cited

U.S. PATENT DOCUMENTS

| | | | | |
|---|---|---|---|---|
| 5,780,333 A | * | 7/1998 | Kim | 438/238 |
| 5,891,785 A | * | 4/1999 | Chang | 438/305 |
| 6,100,145 A | * | 8/2000 | Kepler et al. | 438/300 |
| 6,312,998 B1 | * | 11/2001 | Yu | 438/303 |
| 6,316,304 B1 | * | 11/2001 | Pradeep et al. | 438/230 |
| 2003/0141540 A1 | * | 7/2003 | Kusumi et al. | 257/316 |

FOREIGN PATENT DOCUMENTS

JP  11186401 A  *  7/1999  ....... H01L/21/8234

* cited by examiner

*Primary Examiner*—W. David Coleman
*Assistant Examiner*—Brook Kebede
(74) *Attorney, Agent, or Firm*—F. Chau & Associates, LLC

(57) ABSTRACT

A method of fabricating a semiconductor device having an L-shaped spacer comprises forming a gate pattern on a transistor region of a semiconductor substrate. A disposable spacer is formed on an insulating layer of sidewalls of the gate pattern. Deeply doped source/drain regions are formed aligned with the disposable spacer of the transistor region and in the semiconductor substrate of a resistor region. The disposable spacer and the first insulating layer are removed. A shallowly doped source/drain region is formed aligned with the sides of the gate pattern and adjacent to the deeply doped source/drain region of the transistor region. An L-shaped spacer is formed adjacent to the sidewalls of the gate pattern of the transistor region. A suicide formation protecting layer pattern is simultaneously formed on the resistor region. A metal silicide is formed on an upper surface of the gate electrode, the deeply doped source/drain regions.

20 Claims, 5 Drawing Sheets

METHOD OF FABRICATING A SEMICONDUCTOR DEVICE HAVING AN L-SHAPED SPACER

BACKGROUND OF THE INVENTION

This application claims priority to Korean Patent Application No. 2002-70684, filed on Nov. 14, 2002, in the Korean Intellectual Property Office, the disclosure of which is herein incorporated by reference in its entirety.

1. Field of the Invention

The present invention relates to a method of fabricating a semiconductor device, and more particularly to a method of fabricating a semiconductor device having an L-shaped spacer.

2. Description of the Related Art

Typically, a spacer of a semiconductor device is formed along the sidewalls of a gate electrode. The spacer is used as an implant mask to form a source/drain region and to electrically isolate the gate electrode from the source/drain region.

FIGS. 1 through 5 are illustrations depicting a conventional method of fabricating a semiconductor device having an L-shaped spacer.

Referring to FIG. 1, a gate insulating layer 33 is formed on a semiconductor substrate 31, such as a silicon substrate. A gate electrode 32 is formed on the gate insulating layer 33. The gate insulating layer 33 is formed of oxide or nitride, and the gate electrode 32 is formed of polysilicon. A first insulating layer 48 is formed on the semiconductor substrate 31 and the gate electrode 32. The first insulating layer 48 is formed of oxide. A shallowly doped source region 34 and a shallowly doped drain region 35 are formed in the semiconductor substrate 31. The shallowly doped source region 34 and the shallowly doped drain region 35 are formed by implanting impurities over the surface of the semiconductor substrate 31, where the gate electrode 32 and the first insulating layer 48 are formed. The shallowly doped source region 34 and the shallowly doped drain region 35 are aligned to the sidewalls of the gate electrode 32, wherein the gate electrode 32 prevents a portion of the underlying substrate 31 from being doped.

Referring to FIG. 2, a second insulating layer 36 and a third insulating layer 37, which are to be used as a spacer, are formed on the first insulating layer 48. The second insulating layer 36 is formed of nitride, and the third insulating layer 37 is formed of oxide.

Referring to FIG. 3, the third insulating layer 37 is anisotropically etched to form a first spacer 37 adjacent to the sidewalls of the gate electrode 32. Here, the second insulating layer 36 on an upper portion of the source region 34, the drain region 35, and the gate electrode 32 is exposed as indicated by reference numerals 38, 39, and 40.

Referring to FIG. 4, the second insulating layer 36 on the upper portion of the source region 34, the drain region 35, and the gate electrode 32, as indicated by reference numerals 38, 39, and 30, is etched to form a second spacer 36 at sidewalls of is the gate electrode 32. The second insulating layer 36 is wet etched by using phosphoric acid, and a portion of the second insulating layer 36, which is masked by the first spacer 37 and the first insulating layer 48, is not etched. Impurities are implanted on the surface of the semiconductor substrate 31. The first spacer 37 and the second spacer 36 function as a mask, and a deeply doped source region 43 and a deeply doped drain region 44 are formed by annealing the semiconductor device. Thus, a source extension and a drain extension are formed by the shallowly doped source region 34 and the shallowly doped drain region 35, respectively. The shallowly doped source region 34 and the shallowly doped drain region 35 are formed adjacent to the deeply doped source region 43 and the deeply doped drain region 44.

Referring to FIG. 5, the first spacer 37 and a portion of the first insulating layer 48 are removed. The portion of the first insulating layer 48 is on an upper portion of the deeply doped source region 43, an upper portion of the deeply doped drain region 44, and an upper portion of the gate electrode 32, as indicated by reference numerals 38, 39, and 40. The portion of the first insulating layer 48 is removed by a hydrofluoric (HF) acid etch. The gate electrode 32, the deeply doped source region 43, and the deeply doped drain region 44 are exposed. Silicide contacts 45, 46, and 47 are formed on the deeply doped source region 43, the gate electrode 32, and the deeply doped drain region 44.

According to the conventional method of fabricating a semiconductor device, impurities of the shallowly doped source region 34 and the shallowly doped drain region 35 are diffused when the annealing process is performed to form the deeply doped source region 43 and the deeply doped drain region 35. As a result of the diffused impurities, a short channel effect occurs in a highly-integrated semiconductor device.

Therefore, a need exists for a method of fabricating a semiconductor device having an L-shaped spacer that is capable of preventing a short channel effect from occurring.

SUMMARY OF THE INVENTION

According to an embodiment of the present invention, a method of fabricating a semiconductor device having an L-shaped spacer is provided, wherein the semiconductor device does not exhibit a short channel effect.

According to an embodiment of the present invention, a method of fabricating a semiconductor device comprises forming a gate pattern on a transistor region of a semiconductor substrate including the transistor region and a resistor region, and sequentially forming a buffer insulating layer, a first insulating layer and a second insulating layer on the gate pattern and on a surface of the semiconductor substrate. The method comprises forming a disposable spacer on the first insulating layer adjacent to sidewalls of the gate pattern by etching the second insulating layer, and forming a deeply doped source/drain region in the semiconductor substrate that is aligned with the disposable spacer of the transistor region in the semiconductor substrate of the resistor region. The method further comprises sequentially removing the disposable spacer and the first insulating layer, forming a shallowly doped source/drain region in the semiconductor substrate aligned with the sidewalls of the gate pattern and adjacent to the deeply doped source/drain region of the transistor region, and sequentially forming a third insulating layer and a fourth insulating layer on the buffer insulating layer. The method comprises simultaneously forming an L-shaped spacer adjacent to the sidewalls of the gate pattern of the transistor region by patterning the fourth insulating layer, the third insulating layer, and the buffer insulating layer and forming a silicide formation protecting layer pattern on the resistor region, and forming a metal silicide on an upper surface of the gate electrode, and the deeply doped source/drain region of the transistor region and the resistor region.

According to an embodiment of the present invention a method of fabricating a semiconductor device, thermal load and etch damage is reduced by forming an L-shaped spacer and a silicide formation protecting layer pattern simultaneously, and a short channel effect of a highly-integrated semiconductor device can be effectively prevented by forming a deeply doped source/drain region prior to a shallowly doped source/drain region by using a disposable spacer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
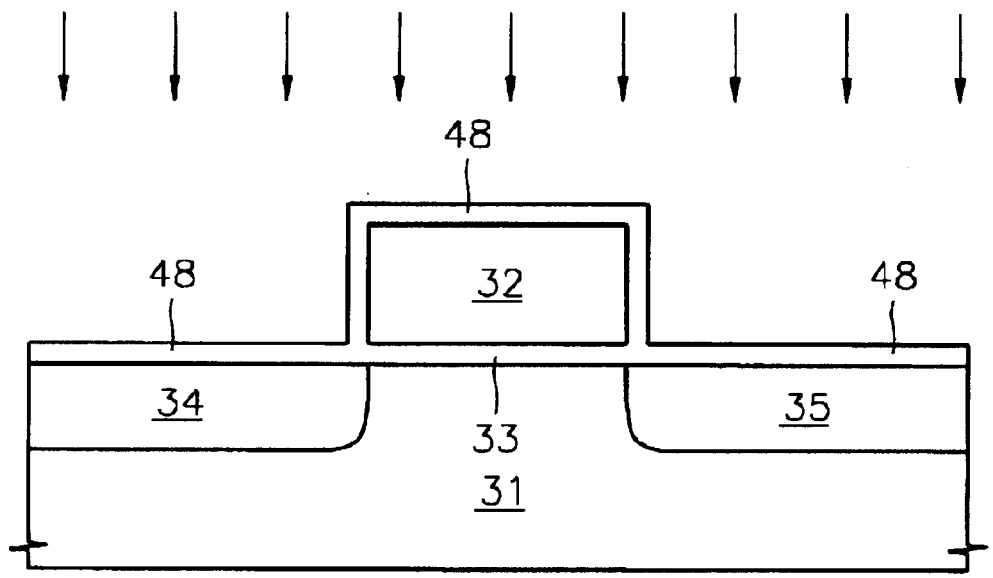
FIGS. 1 through 5 are illustrations depicting a conventional method of fabricating a semiconductor device having an L-shaped spacer.
Figure 2:
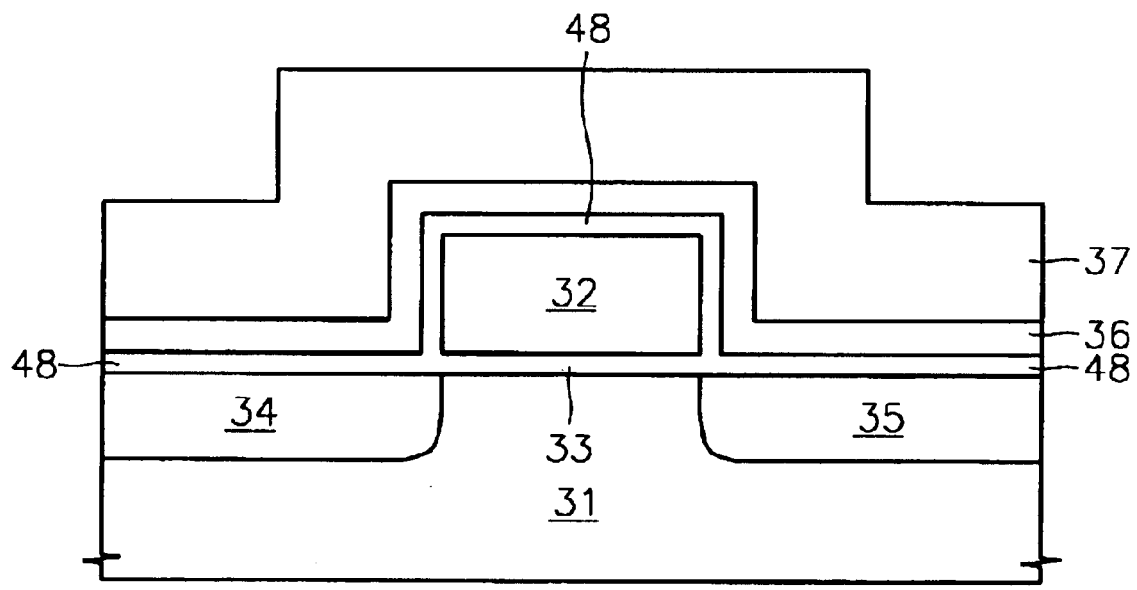
Figure 3:
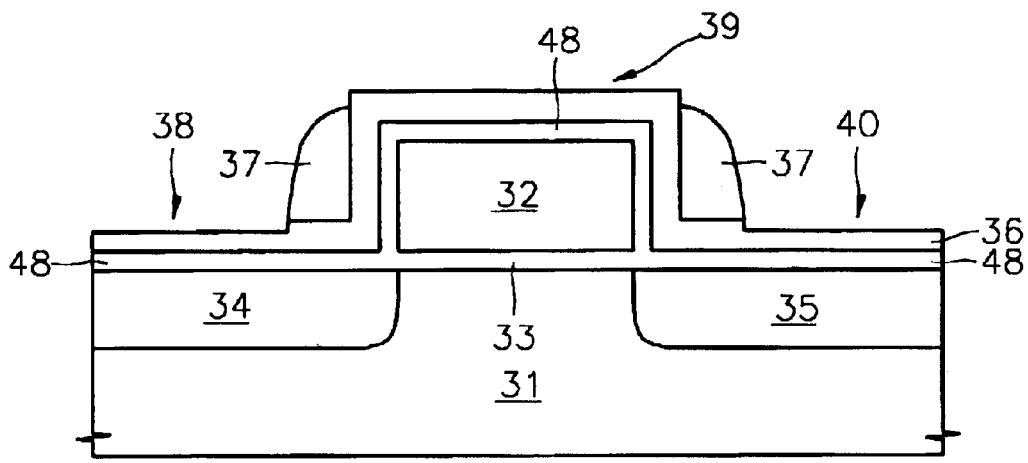
Figure 4:
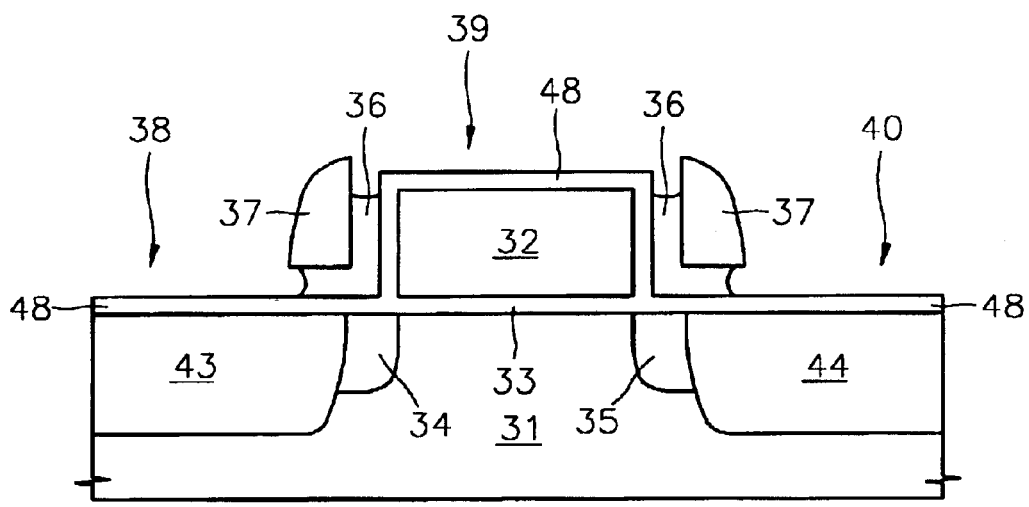
Figure 5:
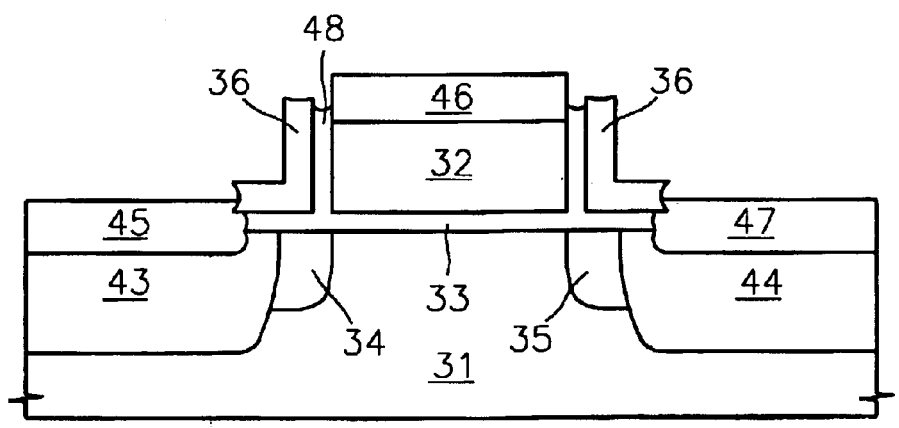

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

FIGS. 6 through 13 are illustrations depicting a method of fabricating a semiconductor device having an L-shaped spacer according to an embodiment of, the present invention.

Figure 6:
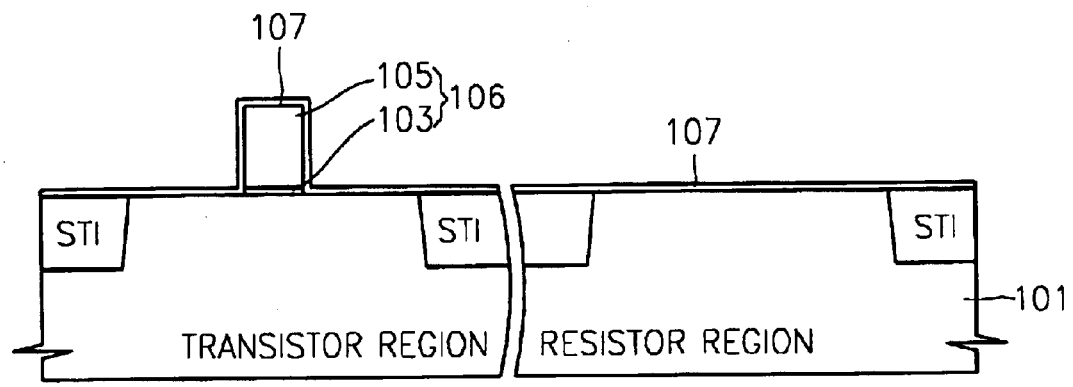
FIGS. 6 through 13 are illustrations depicting a method of fabricating a semiconductor device having an L-shaped spacer according to an embodiment of the present invention.

Referring to FIG. 6, a semiconductor substrate 101 can be divided into a transistor region and a resistor region. A transistor is formed in the transistor region, and a resistor or the like is formed in the resistor region. A gate pattern 106 comprising a gate insulating layer 103 and a gate electrode 105 is formed on the transistor region of the semiconductor substrate 101. The semiconductor substrate 101 is a silicon substrate or a silicon on insulator (SOI) substrate. In FIG. 6, "STI" denotes a shallow trench isolation region, which is an inactive region.

The gate insulating layer 103 is formed of $SiO_2$, $Si_3N_4$, SiON, $ZrO_2$, $HfO_2$, $Ta_2O_5$, or $Al_2O_3$. The gate electrode 105 is formed of a single doped polysilicon film or a combination of a doped polysilicon film, a metal silicide film, and a metal film. The gate pattern 106 is formed by patterning the insulating layer 103 and the gate electrode 105 on the semiconductor substrate 101 by using a photo etching process. The insulating layer 103 is a dielectric layer and the gate electrode 105 is a conductive layer. A line width of the gate pattern 106 is smaller than 1pm in a highly-integrated semiconductor device.

A buffer insulating layer 107 is formed on the surface of the semiconductor substrate 101 and the gate pattern 106. The buffer insulating layer 107 repairs etching damage produced when the gate pattern 106 is formed. The buffer insulating layer 107 is formed of oxide by oxidizing a portion of the semiconductor substrate 101 and a portion of the gate pattern 106.

Figure 7:
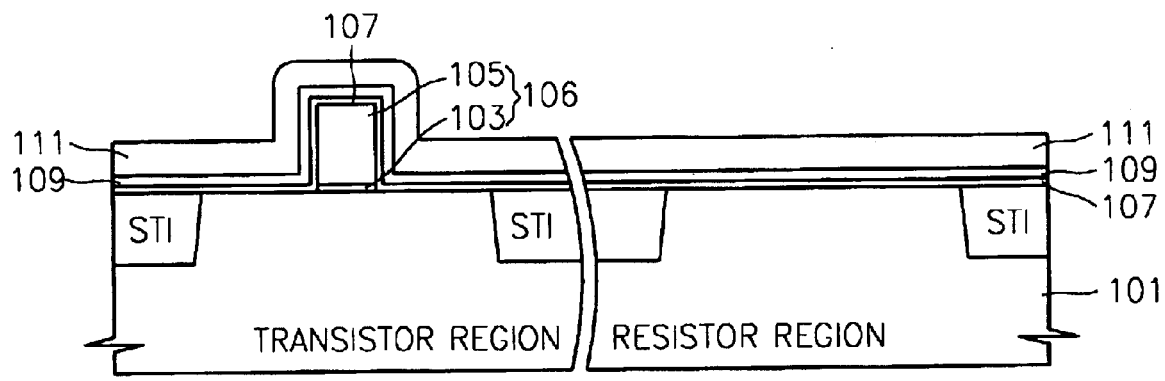

Referring to FIG. 7, a first insulating layer 109 is formed on the buffer insulating layer 107. It is preferable that the thickness of the first insulating layer 109 allows for a deeply doped source/drain region to be formed. It is desirable that the first insulating layer 109 is formed of materials having a high etching selectivity to dry or wet etching of the buffer insulating layer 107. In this embodiment, the first insulating layer 109 is formed of nitride.

A second insulating layer 111 is formed on the first insulating layer 109. The second insulating layer 111 is formed of materials having a high etching selectivity to the first insulating layer 109. In this embodiment, the second insulating layer 111 is formed of oxide.

Figure 8:
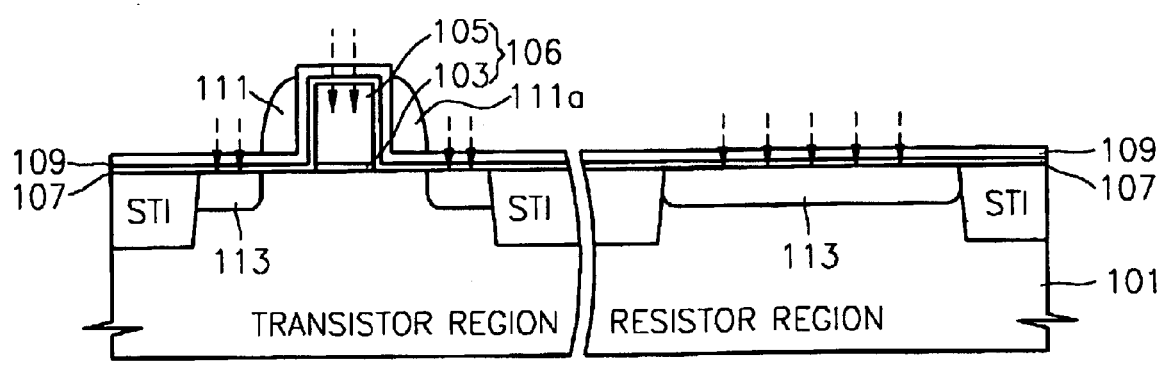

Referring to FIG. 8, a disposable spacer 111a is formed on a portion of the first insulating layer 109 formed adjacent to the sidewalls of the gate pattern 106 by dry etching the second insulating layer 111. Since the second insulating layer 111 formed of oxide has a high etching selectivity to the first insulating layer 109 formed of nitride, dry etching of the second insulating layer 111 is stopped on the first insulating layer 109. The thickness of the second insulating layer 111 determines the width of the disposable spacer, and thus the distance from sidewalls of the gate pattern 106 to the deeply doped source/drain region becomes the width of the disposable spacer. Overetching of the second insulating layer 111 is to be avoided such that the buffer insulating layer 107 on the active region is exposed. The buffer insulating layer 107 is used as a buffer when wet etching is performed to form the disposable spacer.

Impurities are implanted in the surface of the semiconductor substrate 101. The disposable spacer 111a is used as a mask during implantation. An annealing process is performed to activate the implanted impurities. The implanted impurities are P-type impurities or N-type impurities. The annealing process is performed by using a rapid thermal annealing. The impurities are aligned to the disposable spacer 111a, and thus a deeply doped source/drain region 113 is formed in the semiconductor substrate 101 aligned to the sidewalls of the gate pattern 106. The deeply doped source/drain region 113 is formed before a shallowly doped source/drain region, a source/drain extension. According to an embodiment of the present invention, where the deeply doped source/drain region 113 is formed prior to the shallowly doped source/drain region, diffusion of the impurities of the shallowly doped source/drain region can be prevented.

In this embodiment, an annealing process for forming the deeply doped source/drain region 113 is performed immediately after implanting impurities. However, the annealing process can be performed at any other time before the shallowly doped source/drain region is formed. In this embodiment, the deeply doped source/drain region 113 is formed by implanting impurities. However, it can be formed by using other methods such as, solid phase epitaxy or plasma doping.

Figure 9:
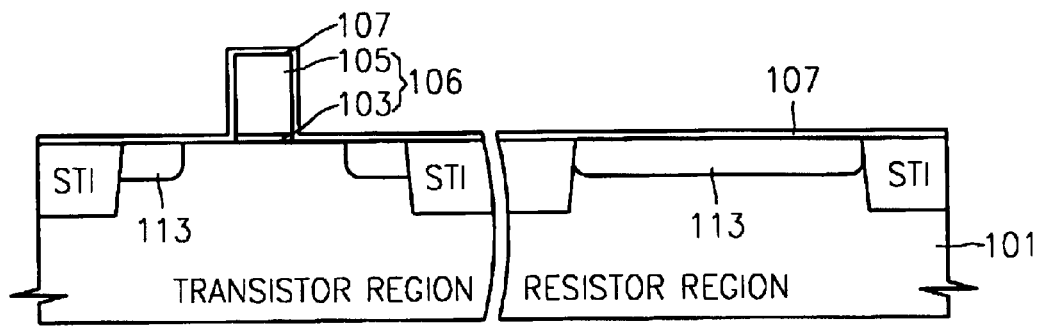

Referring to FIG. 9, the disposable spacer 111a, which is used as a mask to form the deeply doped source/drain region 113, is removed. In this embodiment, the disposable spacer 111a is removed by wet etching, using hydrofluoric (HF) acid. When the disposable spacer 111a is removed by using wet etching, the semiconductor substrate 101 under the first insulating layer 109 and edges under the gate electrode 105 are not damaged because the first insulating layer 109 formed of nitride has a high etching selectivity to the disposable spacer 111a formed of oxide.

The first insulating layer 109 is removed by etching. In this embodiment, the first insulating layer 109 is removed by wet etching, using phosphoric acid. During the removal of the first insulating layer 109, the semiconductor substrate 101 under the buffer insulating layer 107 and the edges under the gate electrode 105 are not damaged because the first insulating layer 109 formed of nitride has a greater etching selectivity than the buffer insulating layer 107 formed of oxide by a ratio of 40 to 1. Accordingly, only the buffer insulating layer 107 remains on the semiconductor substrate 101 and the gate electrode 105.

Figure 10:
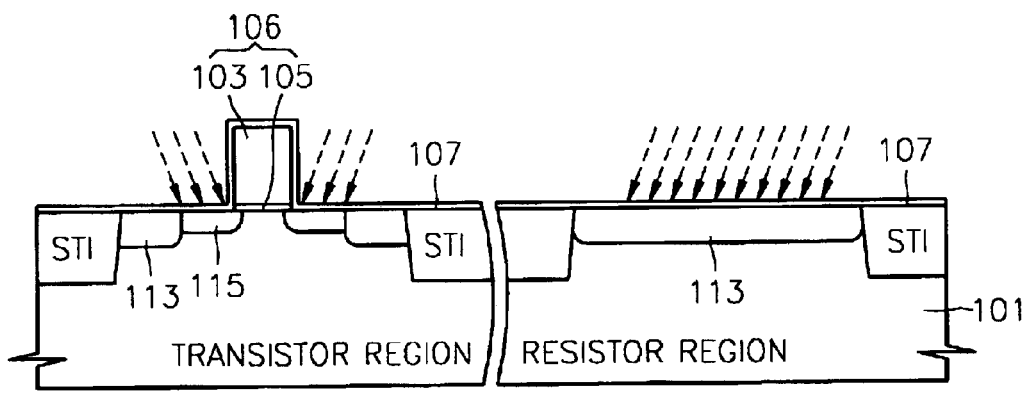

Referring to FIG. 10, impurities are implanted in the surface of the semiconductor substrate 101 where the buffer insulating layer 107 is formed. An annealing process is performed to activate the implanted impurities. The implanted impurities are P-type impurities or N-type impurities. The annealing process is performed at a low temperature of about 500–800° C., or performed by using rapid thermal annealing at a temperature of about 900–1300° C. The annealing process can also be performed as a thermal spike process at a temperature of about 900–1300° C. The thermal spike process is performed more rapidly than the rapid thermal annealing. For example, for the thermal spike process, after the temperature is raised at a rate of 200° C. per second, the thermal process is performed for a few seconds. Thus, a shallowly doped source/drain region 115 is formed adjacent to the deeply doped source/drain region 113 in the semiconductor substrate 101 aligned to the sidewalls of the gate pattern 106. The shallowly doped source/drain region 115, which is a source/drain extension, is formed after the deeply doped source/drain region 113 is formed. Thus, a short channel effect of a highly-integrated semiconductor device can be prevented from occurring when impurities of the shallow deeply doped source/drain region 115 are diffused.

In this embodiment, the annealing process is performed immediately following the implantation of impurities to form the shallowly doped source/drain region 115. However, it can be performed at any other time before a metal silicide film is formed. The annealing process can even be omitted from the formation of the shallowly doped source/drain region 115. To form a source/drain region that Is shallower than the shallowly doped source/drain region 115, the buffer insulating layer 107 can be wet etched before the shallowly doped source/drain region 115 is formed. In this embodiment, the shallowly doped source/drain region 115 is formed by implantation. However, it can be formed by solid phase epitaxy or plasma doping.

Figure 11:
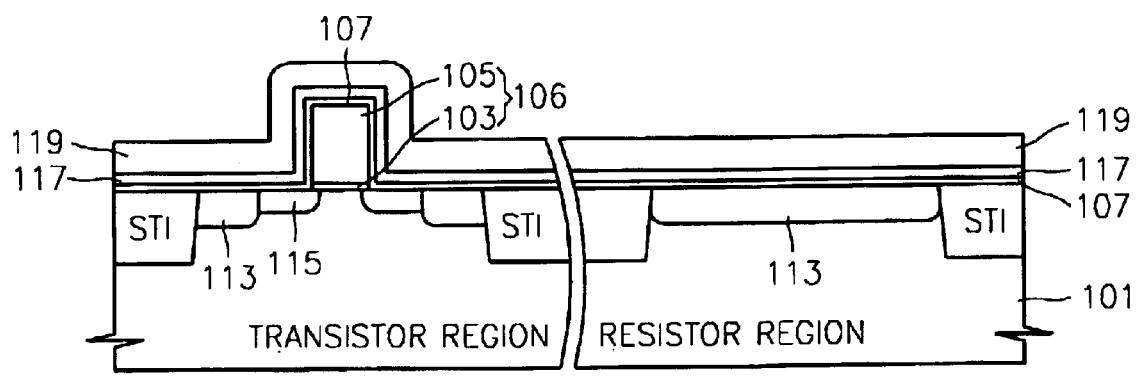

Referring to FIG. 11, a third insulating layer 117 is formed on the buffer insulating layer 107. A fourth insulating layer 119 is formed on the third insulating layer 117. The fourth insulating layer 119 is formed of materials having a high etching selectivity to the third insulating layer 117. In this embodiment, the third insulating layer 117 is formed of nitride, and the fourth insulating layer 119 is formed of oxide.

Figure 12:
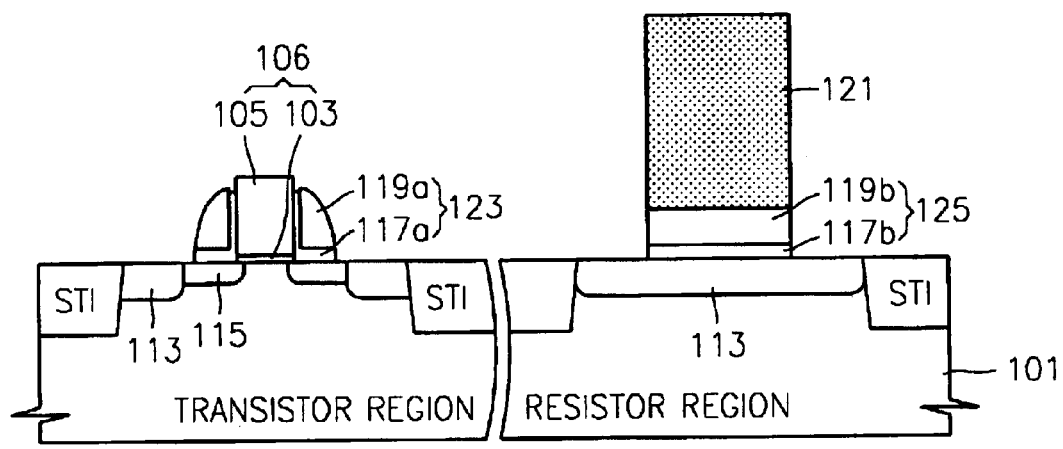

Referring to FIG. 12, a mask pattern 121 is formed to define a silicide formation protecting region on the fourth insulating layer 119 of the resistor region. The mask pattern 121 is formed as a photoresist pattern by using a photo etching process.

The fourth insulating layer 119, and the third insulating layer 117 of the transistor region and the resistor region are etched simultaneously. The fourth insulating layer 119 and the third insulating layer 117 of the resistor region are etched by using the mask pattern 121 as an etching mask. The third insulating layer 117 has a thickness sufficient to prevent overetching. An L-shaped spacer 123 is formed of a fourth insulating pattern 119a and a third insulating pattern 117a at sidewalls of the gate pattern 106 in the transistor region. The thickness of the fourth insulating layer 119 and the third insulating layer 117 determines the width of the spacer 123. A silicide formation protecting layer pattern 125 is formed of a fourth insulating pattern 119b and a third insulating pattern 117b in the resistor region.

Since the L-shaped spacer 123 and the silicide formation protecting layer pattern 125 are formed simultaneously, the method of fabricating the semiconductor device has a low thermal load and causes little etching damage in comparison to the conventional art. In addition, the deeply doped source/drain region is formed before the shallowly doped source/drain region is formed, thus a short channel effect can effectively be prevented in a highly-integrated semiconductor device.

The buffer insulating layer 107 remaining on the surface of the semiconductor substrate 101 is etched and removed. The buffer insulating layer 107 can be removed while etching is performed to form the spacer or the silicide formation protecting layer 125. The upper portion of the gate electrode 105 and the surface of the deeply doped source/drain region 113 are exposed.

Figure 13:
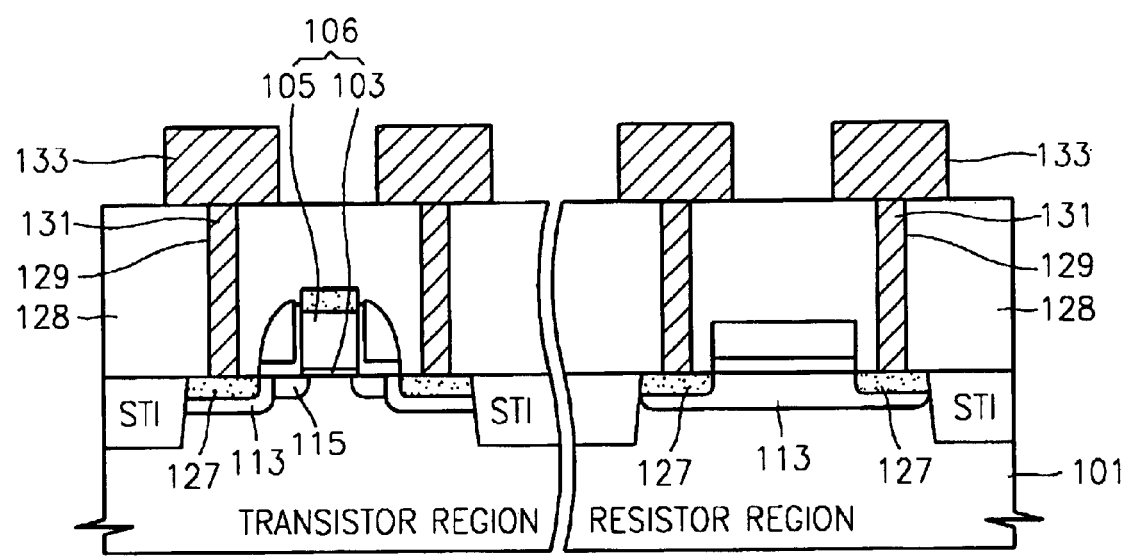

Referring to FIG. 13, a metal silicide 127 is formed. The metal silicide 127 forms a contact having a low resistance on the gate pattern 106 and the deeply doped source/drain region 113. The metal silicide 127 is formed of cobalt silicide, nickel silicide, or titanium silicide. The distance from sidewalls of the gate electrode 105 to the metal silicide 127 is the width of the L-shaped spacer 123. Here, an exposed area of the upper portion of the gate pattern 106 is increased by using the L-shaped spacer 123, thus an area of the metal silicide 127 is increased, and the resistance of the gate pattern 106 can be reduced. In addition, the method according to an embodiment of the present invention can reduce a leakage current because the metal silicide 127 is formed only in the deeply doped source/drain region 113.

An interlayer insulating layer 128 is formed on the transistor region and the resistor region. A metal contact hole 129 is formed over the metal silicide 127. A metal plug 131 fills the metal contact hole 129 and a metal film 133 is formed on the metal plug 131.

According to an embodiment of the present invention, a method of fabricating a semiconductor device comprising an L-shaped spacer 123 and a suicide formation protecting layer pattern 125, which are formed simultaneously, has a low thermal load and little etching damage as compared to a device manufactured by conventional methods.

In addition, since the deeply doped source/drain region is formed before the shallowly doped source/drain region 115 is formed by using a disposable spacer, a short channel effect can effectively be prevented in a highly-integrated semiconductor device.

Further, the method according to an embodiment of the present invention can reduce the leakage current and resistance of the gate pattern 106 by using the L-shaped spacer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device comprising:

forming a gate pattern on a transistor region of a semiconductor substrate including the transistor region and a resistor region;

forming sequentially a buffer insulating layer, a first insulating layer and a second insulating layer on the gate pattern and on a portion of a surface of the semiconductor substrate;

etching the second insulating layer to form a disposable spacer on a portion of the first insulating layer adjacent to sidewalls of the gate pattern;

forming a deeply doped region in the semiconductor substrate that is aligned with the disposable spacer of the transistor region as a deeply doped source/drain region, and in the semiconductor substrate of the resistor region;

removing the disposable spacer and the first insulating layer;

forming a shallowly doped source/drain region in the semiconductor substrate aligned to the sidewalls of the gate pattern and adjacent to the deeply doped source/drain region of the transistor region;

forming sequentially a third insulating layer and a fourth insulating layer on the buffer insulating layer;

forming simultaneously an L-shaped spacer adjacent to the sidewalls of the gate pattern of the transistor region by patterning the fourth insulating layer, the third insulating layer, and the buffer insulating layer and forming a silicide formation protecting layer pattern on the resistor region; and forming a metal silicide on the deeply doped region of the transistor region, the resistor region, and an upper surface of the gate electrode.

2. The method of claim 1, wherein a mask pattern is formed in the resistor region after forming the fourth insulating layer, wherein the mask pattern is used as an etching mask when the silicide formation protecting layer pattern is formed.

3. The method of claim 1, wherein the second insulating layer is formed of materials selective to the first insulating layer.

4. The method of claim 3, wherein the second insulating layer is formed of oxide, and the first insulating layer is formed of nitride.

5. The method of claim 1, wherein the first insulating layer is formed of materials selective to the buffer insulating layer.

6. The method of claim 5, wherein the first insulating layer is formed of nitride, and the buffer insulating layer is formed of oxide.

7. The method of claim 1, wherein forming the deeply doped source/drain region comprises:
implanting impurities in the semiconductor substrate, wherein the disposable spacer is a mask; and
annealing the implanted impurities.

8. The method of claim 7, wherein the implanted impurities are annealed before the shallowly doped source/drain region is formed.

9. The method of claim 1, wherein forming the shallowly doped source/drain region comprises:
implanting impurities in the semiconductor substrate where the buffer insulating layer is formed; and
annealing the implanted impurities.

10. The method of claim 9, wherein the implanted impurities are annealed before the metal silicide is formed.

11. The method of claim 9, wherein the impurities are annealed at a temperature of about 500–800° C., or by rapid thermal annealing at a temperature of about 900–1300° C., or a spike thermal processing at a temperature of about 900–1300° C.

12. The method of claim 1, wherein the fourth insulating layer is formed of materials selective to the third insulating layer.

13. The method of claim 12, wherein the fourth insulating layer is formed of oxide, and the third insulating layer is formed of nitride.

14. The method of claim 1, wherein the shallowly doped source/drain region is formed by using implantation of impurities, solid phase epitaxy, or plasma doping.

15. The method of claim 1, wherein the distance from sidewalls of the gate pattern to the deeply dope source/drain region becomes the width of the disposable spacer, and the distance from the sidewalls of the gate pattern to the metal silicide becomes the width of the spacer.

16. The method of claim 1, wherein the semiconductor substrate is a silicon substrate or a silicon on insulator substrate.

17. The method of claim 1, wherein the gate pattern is formed by sequentially forming the gate insulating layer and the gate electrode.

18. The method of claim 17, wherein the gate insulating layer is selected from the group consisting of $SiO_2$, $Si_3N_4$, $SiON$, $ZrO_2$, $HfO_2$, $Ta_2O_5$, and $Al_2O_3$.

19. The method of claim 17, wherein the gate electrode is formed of a single doped polysilicon film or a film comprising a doped polysilicon film and a metal film.

20. The method of claim 1, wherein the metal silicide is selected from the group consisting of cobalt silicide, nickel silicide, and titanium silicide.

* * * * *